United States Patent
Nakamura et al.

(10) Patent No.: US 7,507,650 B2
(45) Date of Patent: Mar. 24, 2009

(54) PROCESS FOR PRODUCING SCHOTTKY JUNCTION TYPE SEMICONDUCTOR DEVICE

(75) Inventors: Tomonori Nakamura, Yokosuka (JP); Hidekazu Tsuchida, Yokosuka (JP); Toshiyuki Miyanagi, Yokosuka (JP)

(73) Assignee: Central Research Institute of Electric Power Industry, Tokyo (JP)

( * ) Notice: Subject to any disclaimer, the term of this patent is extended or adjusted under 35 U.S.C. 154(b) by 211 days.

(21) Appl. No.: 10/594,044

(22) PCT Filed: Mar. 25, 2005

(86) PCT No.: PCT/JP2005/005530

§ 371 (c)(1),
(2), (4) Date: Sep. 25, 2006

(87) PCT Pub. No.: WO2005/093840

PCT Pub. Date: Oct. 6, 2005

(65) Prior Publication Data

US 2007/0134897 A1 Jun. 14, 2007

(30) Foreign Application Priority Data

Mar. 26, 2004 (JP) ............................. 2004-092660

(51) Int. Cl.
*H01L 21/28* (2006.01)
(52) U.S. Cl. ............................... 438/570; 257/E21.047
(58) Field of Classification Search ................. 438/570; 257/E21.047
See application file for complete search history.

(56) References Cited

U.S. PATENT DOCUMENTS 7,262,434 B2    8/2007    Okamura et al.
2003/0183895 A1*   10/2003   Okamura et al. ............ 257/454

FOREIGN PATENT DOCUMENTS

| EP | 1349202 A2 | 10/2003 |
|---|---|---|
| JP | 5-55552 A | 3/1993 |
| JP | 6-84967 A | 3/1994 |
| JP | 2000-164528 A | 6/2000 |
| JP | 2000-188406 A | 7/2000 |
| JP | 2003-068760 A | 3/2003 |

(Continued)

OTHER PUBLICATIONS

Bhatnager, Mohit et al., "Comparison of 6H-SiC, 3C-SiC, and Si for Power Devices", *IEEE Transactions on Electron Devices*, vol. 40, No. 3, Mar. 1993, pp. 645-655.

(Continued)

*Primary Examiner*—Matthew Smith
*Assistant Examiner*—Walter H Swanson
(74) *Attorney, Agent, or Firm*—The Webb Law Firm

(57) ABSTRACT

A process for producing a Schottky junction type semiconductor device includes the steps of forming a Schottky electrode on a surface of a silicon carbide epitaxial layer, wherein a Schottky electrode made of molybdenum, tungsten, or an alloy thereof is formed on the surface of the silicon carbide epitaxial layer and is subjected to heat treatment so as to induce an alloying reaction at an interface of the silicon carbide epitaxial layer and the Schottky electrode, thereby forming an alloy layer at the interface, whereby the height of a Schottky barrier is controlled while maintaining an n-factor at a nearly constant low value.

7 Claims, 3 Drawing Sheets

FOREIGN PATENT DOCUMENTS

| | | |
|---|---|---|
| JP | 2003-258271 A | 9/2003 |
| JP | 2004-221513 A | 8/2004 |

OTHER PUBLICATIONS

Singh, Ranbir et al., "SiC Power Schottky and PiN Diodes", *IEEE Transactions on Electron Devices*, vol. 49, No. 4, Apr. 2002, pp. 665-672.

Weiss, R. et al., "Tungsten, Nickel, and Molybdenum Schottky Diodes With Different Edge Termination", *Applied Surface Science*, 184 (2001) pp. 413-418.

Syrkin, A.L. et al., "Surface Barrier Height in Metal-SiC Structures of 6H, 4H and 3C Polytypes", *Materials Science & Engineering B*, B46 (1997), pp. 236-239.

Weiss, R. et al., "Tungsten, nickel, and molybdenum Schottky diodes with different edge termination", Applied Surface Science 184 (2001) 413-418, Elsevier Science B.V.

* cited by examiner (a)

(b)

PROCESS FOR PRODUCING SCHOTTKY JUNCTION TYPE SEMICONDUCTOR DEVICE

TECHNICAL FIELD

The present invention relates to a process for producing a Schottky junction type semiconductor device in which a Schottky electrode is formed on the surface of a silicon carbide epitaxial layer.

BACKGROUND ART

Silicon carbide (SiC) is a semiconductor that has excellent material property values in which the band gap of silicon carbide is approximately three times as large as that of silicon (Si), the saturation drift speed of silicon carbide is approximately twice as high as that of silicon, and the dielectric breakdown field strength of silicon carbide is approximately ten times as strong as that of silicon. Accordingly, silicon carbide has been developed as a material of a semiconductor device for electric power, and a Schottky diode formed by using silicon carbide is put on the market at present.

The Schottky diode is composed of an SiC monocrystal substrate that has been obtained by slicing an SiC bulk monocrystal into wafers where the SiC bulk monocrystal is grown by the sublimation method, an epitaxial layer that has been obtained by growing an SiC monocrystal film on the surface of the SiC monocrystal substrate with the chemical vapor deposition (CVD) method, a Schottky electrode that has been formed on the surface of the epitaxial layer by the sputtering method, vacuum deposition method, or the like, and an ohmic electrode that has been formed on the rear surface of the SiC monocrystal substrate. The Schottky electrode is made of a material such as nickel or titanium (see the patent document 1).

The power loss must be reduced for a Schottky junction type semiconductor device that is used for electric power such as a Schottky diode. The power loss of the Schottky diode depends on the Schottky barrier height (SBH) at the junction interface of the Schottky electrode and the SiC epitaxial layer. The power loss of the Schottky diode is based on the sum of the power loss at a forward direction flow of an electric current and the power loss caused by a leak current at an action of a reverse voltage.

For instance, the power loss density of the Schottky diode is described as ½ $(V_f J_f + V_r J_r)$ at a 50% duty cycle (see the non-patent document 1). Here, $V_r$ is a reverse voltage, $J_f$ is a forward current, $V_f$ is a forward voltage, and $J_r$ is a reverse current. The evaluation of the Schottky diode is represented with $V_r$ and $J_f$. On the other hand, $V_f$ and $J_r$ depend on the Schottky barrier height. In the case in which the power loss of a 4H—SiC Schottky diode is calculated where $J_f$ is 100 Acm$^{-2}$ and $V_r$ is 4 kV for example, the power loss of the 4H—SiC Schottky diode becomes minimum when the Schottky barrier height is in the range of 1.18 to 1.3 eV at a temperature of the range of 25 to 200° C.

A Schottky diode with the reverse withstanding voltage of the range of 0.6 to 5.0 kV is used in many cases. For such a reverse withstanding voltage, the power loss becomes a minimum in the case in which the Schottky barrier height is in the range of 0.9 to 1.3 eV. However, in the case in which the Schottky electrode is made of nickel or titanium, the Schottky barrier height is approximately 1.6 eV for nickel and 0.8 eV for titanium. Consequently, the power loss of the Schottky diode cannot be a minimum.

It is proposed that a Schottky electrode made of titanium is formed on the SiC layer and a heat treatment is performed at the specified temperature in order to control the Schottky barrier height. However, in the case in which a Schottky electrode made of titanium is formed and a heat treatment is performed, the value of an ideal factor (n-factor), which is a parameter indicating the performance of the Schottky diode, is increased and extremely deviated from the ideal value 1 as shown in FIG. 2.

In general, in the case in which an electric current, which passes through the Schottky barrier interface, passes only over the barrier, that is the case of only the thermal diffusion current transportation, a current increases in an exponential function manner in comparison with a voltage. The value of an electric current is expressed by exp(eV/kT)−1; here, e is a prime electric charge, V is a voltage, k is the Boltzmann's constant, and T is a temperature. However, in the case in which an electric current passes not only over the barrier but also through the barrier by tunneling, an electric current flows even if a voltage is low, and the value of an electric current is deviated from the above expression. Consequently, the voltage V is replaced with V/n to visually correspond to the expression, thus expressing the value of an electric current as exp(eV/nkT)−1. The item n is an ideal factor and the value of n is 1 in the ideal case of only the thermal diffusion transportation current. However, the value of the n-factor is larger than 1 in the actual case in which other electric currents flow by many kinds of factors.

As described above, in the case in which a Schottky electrode made of titanium is formed and a heat treatment is executed at the specified temperature in order to control the Schottky barrier height, the value of the n-factor becomes greatly larger than 1, thus deteriorating the performance of the Schottky diode and increasing a leak current at an action of a reverse voltage.

Patent Document 1: Japanese Patent Laid-Open Publication No. 2000-188406

Non-patent document 1: IEEE Trans. Electron Devices, March 1993, Vol. 40, third issue, p. 645-655

Non-patent document 2: IEEE Trans. Electron Devices, April 2002, Vol. 49, fourth issue, p. 665-672

SUMMARY OF THE INVENTION

The present invention has been made in order to solve the above problems. An object of the present invention is to provide a process for producing a Schottky junction type semiconductor device capable of controlling the height of a Schottky barrier to be the desired value that minimizes the power loss without increasing an n-factor in the case in which a general Schottky diode with the withstanding voltage of the range of 0.6 to 5.0 kV is obtained.

The present inventors have formed a Schottky electrode made of molybdenum or tungsten and performed a heat treatment. As a result, the present inventors have achieved the present invention by finding that the height of a Schottky barrier can be controlled to be the desired optimum value (the range of 1.0 to 1.3 eV) that enables the power loss to be minimized while maintaining an n-factor to 1.05 or a lower value.

A process for producing a Schottky junction type semiconductor device is characterized by comprising forming a Schottky electrode on a surface of a silicon carbide epitaxial layer, wherein a Schottky electrode made of molybdenum, tungsten, or an alloy thereof is formed on the surface of the silicon carbide epitaxial layer and is subjected to heat treatment so as to induce an alloying reaction at an interface of the silicon carbide epitaxial layer and the Schottky electrode, thereby forming an alloy layer at the interface, whereby the height of a Schottky barrier is controlled while maintaining an n-factor at a nearly constant low value.

The heat treatment is performed at a temperature in the range of 300 to 1200° C., preferably 400 to 700° C. By the above step, the height of a Schottky barrier can be controlled to be any value in the range of 1.0 to 1.3 eV (1.1 to 1.3 eV for molybdenum and 1.0 to 1.1 eV for tungsten) while maintaining an n-factor to 1.05 or a lower value.

According to the present invention, the height of a Schottky barrier can be controlled to be the desired value in the range that enables the power loss to be minimized without greatly increasing an n-factor.

Moreover, since a high temperature heat treatment has been applied to the Schottky electrode in the manufacturing process in advance, a Schottky junction type semiconductor device with excellent characteristics in a high temperature environment and with a high heat resistance property against heat caused by a surge current, etc. can be obtained.

DETAILED DESCRIPTION OF THE INVENTION

Figure 1:
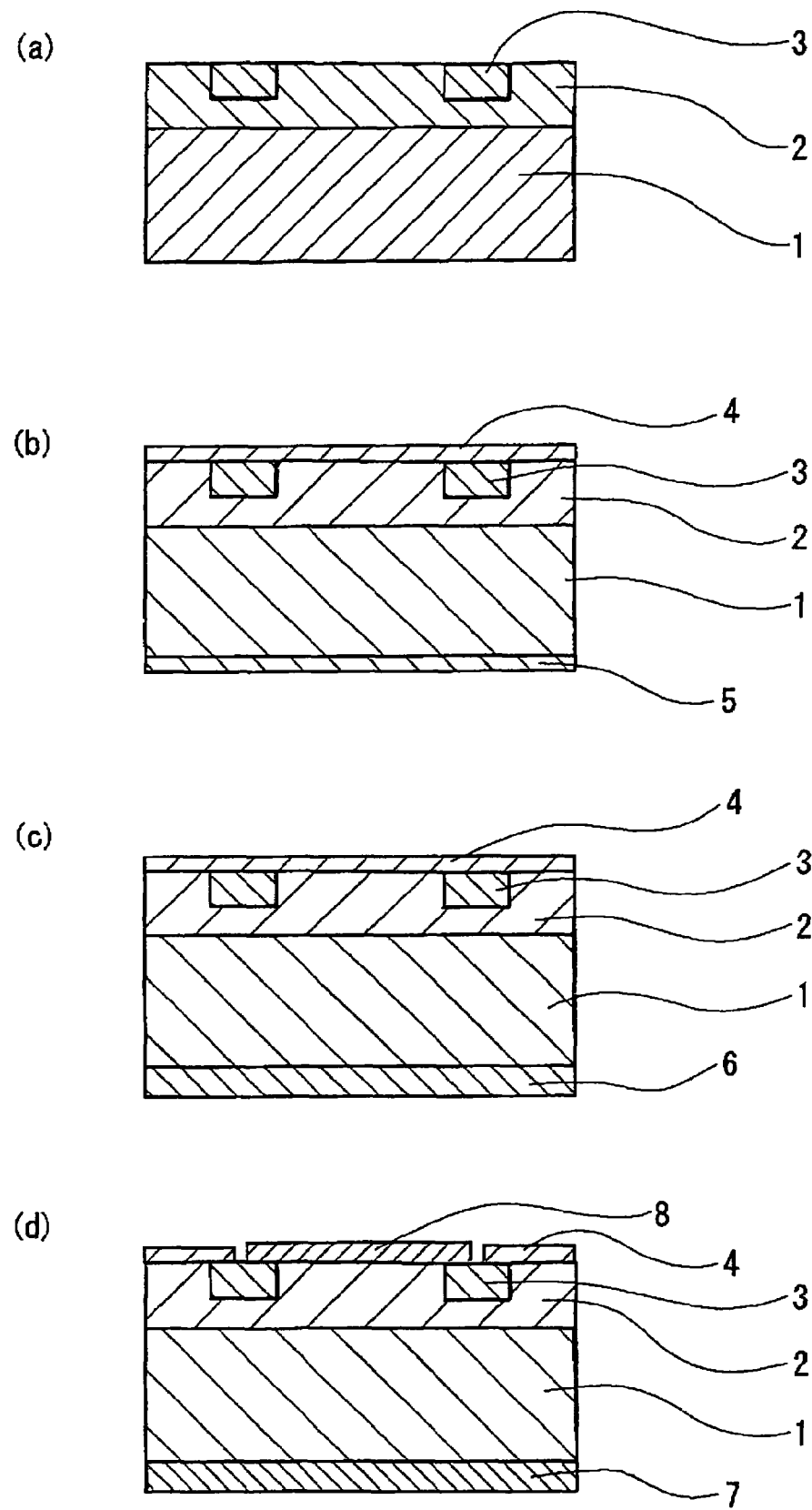
FIGS. 1(a)-(d) are cross-sectional views for illustrating the manufacturing process of a Schottky diode related to an embodiment of the present invention.

An embodiment of the present invention will be described below in detail with reference to the drawings. FIGS. 1(a) to 1(d) are cross-sectional views for illustrating the manufacturing process of a Schottky diode related to an embodiment of the present invention. In FIG. 1(a), the reference numeral 1 shows an SiC monocrystal substrate, the reference numeral 2 shows an SiC epitaxial layer, and the reference numeral 3 shows an ion implanted layer. The SiC monocrystal substrate 1 is an n-type 4H—SiC substrate in which impurities have been doped in a high concentration ($5 \times 10^{18}$ cm$^{-3}$). The SiC monocrystal substrate is formed by slicing an SiC bulk crystal which has been grown by the sublimation method (modified Lely method).

In the modified Lely method, SiC powder that has been put into a crucible is heated at the range of 2200 to 2400° C. for vaporization, and is deposited on the surface of the seed crystal at a speed of the range of 0.8 to 1 mm per hour in general for bulk growth. The formed ingot is sliced at the specified thickness in such a manner that a desired crystal plane is exposed, and the SiC monocrystal substrate 1 is obtained.

The surface of the SiC monocrystal substrate 1 is smoothed by a treatment such as polishing. The surface of the sliced wafer is treated by hydrogen etching or chemical mechanical polishing (CMP), etc., to be smoothed in the specular morphology, thus reducing the propagation density of basal plane dislocations to an epitaxial film.

Next, the epitaxial growth of an SiC monocrystal film from the smoothed surface of the SiC monocrystal substrate 1 is performed by the CVD method. Propane, etc. is used as the source gas of carbon, and silane, etc. is used as the source gas of silicon. The mixed gas of the source gases, a carrier gas such as hydrogen, and nitrogen as a dopant gas is supplied to the surface of the SiC monocrystal substrate 1.

For instance, the epitaxial growth of the SiC is performed at a growth speed of the range of 2 to 20 µm per hour under the condition of the range of 1500 to 1600° C. and 40 to 80 Torr in the gas ambient atmosphere. By the above step, the step flow growth of the 4H—SiC monocrystal with the crystal type same as that of the SiC monocrystal substrate 1 is performed in order to form the SiC epitaxial layer 2 with a film thickness of 30 µm in which nitrogen of $2.2 \times 10^{15}$ cm$^{-3}$ has been doped as an impurity.

As an actual apparatus for the epitaxial growth, a vertical type hot wall reactor can be used. A water cooling double cylinder tube made of quartz is attached to the vertical type hot wall reactor. A cylindrical heat insulating material, a hot wall made of graphite, and a wedge type suscepter for holding the SiC monocrystal substrate in a vertical direction are installed in the water cooling double cylinder tube. A high frequency heating coil is installed on the external periphery of the water cooling double cylinder tube. The high frequency heating coil is used to heat the hot wall by high frequency induction, and the SiC monocrystal substrate that is held by the wedge type suscepter is heated by radiant heat from the hot wall. The epitaxial growth of the SiC is performed on the surface of the SiC monocrystal substrate by supplying a reaction gas from the lower section of the water cooling double cylinder tube while heating the SiC monocrystal substrate.

After the SiC epitaxial layer 2 is formed on the surface of the SiC monocrystal substrate 1, the SiC monocrystal substrate is cleaned chemically and put into a thermal oxidation furnace for an oxidation treatment of approximately one hour at 1125° C. By the above step, an oxide film that acts as a protection film for preventing contamination at ion implantation is formed on the SiC epitaxial layer 2.

Next, a part of the oxide film is removed to form an opening by photo lithography. The SiC epitaxial layer 2 is exposed from the opening. The ion implantation of aluminum is then performed to the opening as a p-type impurity to form an aluminum ion implanted layer 3 (junction termination extension (JTE)). The aluminum ion implanted layer 3 is formed at the periphery edge of the Schottky electrode to relax the electric field concentration at the periphery edge of the Schottky electrode that will be formed later and to improve a voltage withstanding capability. The aluminum ion concentration in the aluminum ion implanted layer 3 is controlled in such a manner that the aluminum ion concentration is decreased toward the outside from the center. The aluminum ion concentration is $2.2 \times 10^{18}$ cm$^{-3}$ at the center and $3 \times 10^{17}$ cm$^{-3}$ at the outside. After the implantation of aluminum ions, a heat treatment is performed at 1700° C. for three minutes to electrically activate aluminum.

Subsequently, after the formed SiC monocrystal substrate is cleaned chemically, an oxidation treatment is performed at 1200° C. for five hours to form SiO$_2$ oxide films 4 and 5 on the both surfaces of the SiC monocrystal substrate as shown in FIG. 1(b). After the SiO$_2$ oxide film 5 is removed from the rear surface of the SiC monocrystal substrate 1 by using buffered hydrofluoric acid, a nickel film 6 with a film thickness of 350 nm is deposited on the rear surface of the SiC monocrystal substrate by the vacuum deposition method as shown in FIG. 1(c), and a heat treatment is performed at 1050° C. for ninety seconds. By this heat treatment, an alloy (nickel silicide) layer is formed from the nickel film 6 and the SiC monocrystal substrate 1 to function as an ohmic electrode 7 as shown in FIG. 1(d).

After the ohmic electrode 7 is formed, the $SiO_2$ oxide film 4 in the area in which the Schottky electrode will be formed is removed by photo lithography similarly to the above step. A molybdenum film 8 (Schottky electrode) with a film thickness of 100 nm is then deposited on the surface of the SiC epitaxial layer 2 by using argon (Ar) as a sputtering gas at the range of a room temperature to 50° C. for several minutes by the sputtering method.

After the molybdenum film 8 is deposited on the SiC epitaxial layer 2, a heat treatment is performed at the specified temperature. Preferably, a heat treatment should be performed in the ambient atmosphere of an inert gas such as argon or nitrogen.

By the above heat treatment, an alloying reaction is progressed at an interface of the silicon carbide epitaxial layer 2 and the Schottky electrode 8, thereby forming an alloy layer of several nm at the interface. The existence of the alloy layer can be observed as a contrast image by a high resolution transmission type electron microscope. It is thought that the composition of the alloy layer is an alloy composed of MoC and MoSi.

By forming the alloy layer with a heat treatment, the material property can be stabilized against the temperature conditions in using a Schottky diode, and the Schottky barrier height can be controlled in such a manner that the Schottky barrier height can be the desired value in the range in which the power loss can be minimized. That is, by performing the heat treatment at a temperature in the range of 300 to 1200° C., preferably 400 to 700° C., the Schottky barrier height can be controlled to be any value in the range of 1.1 to 1.3 eV (1.1 to 1.25 eV at a temperature in the range of 400 to 700° C.). In this case, the n-factor is not fluctuated even by the heat treatment in the above temperature range and can be maintained to a value of approximately 1.

Figure 2:
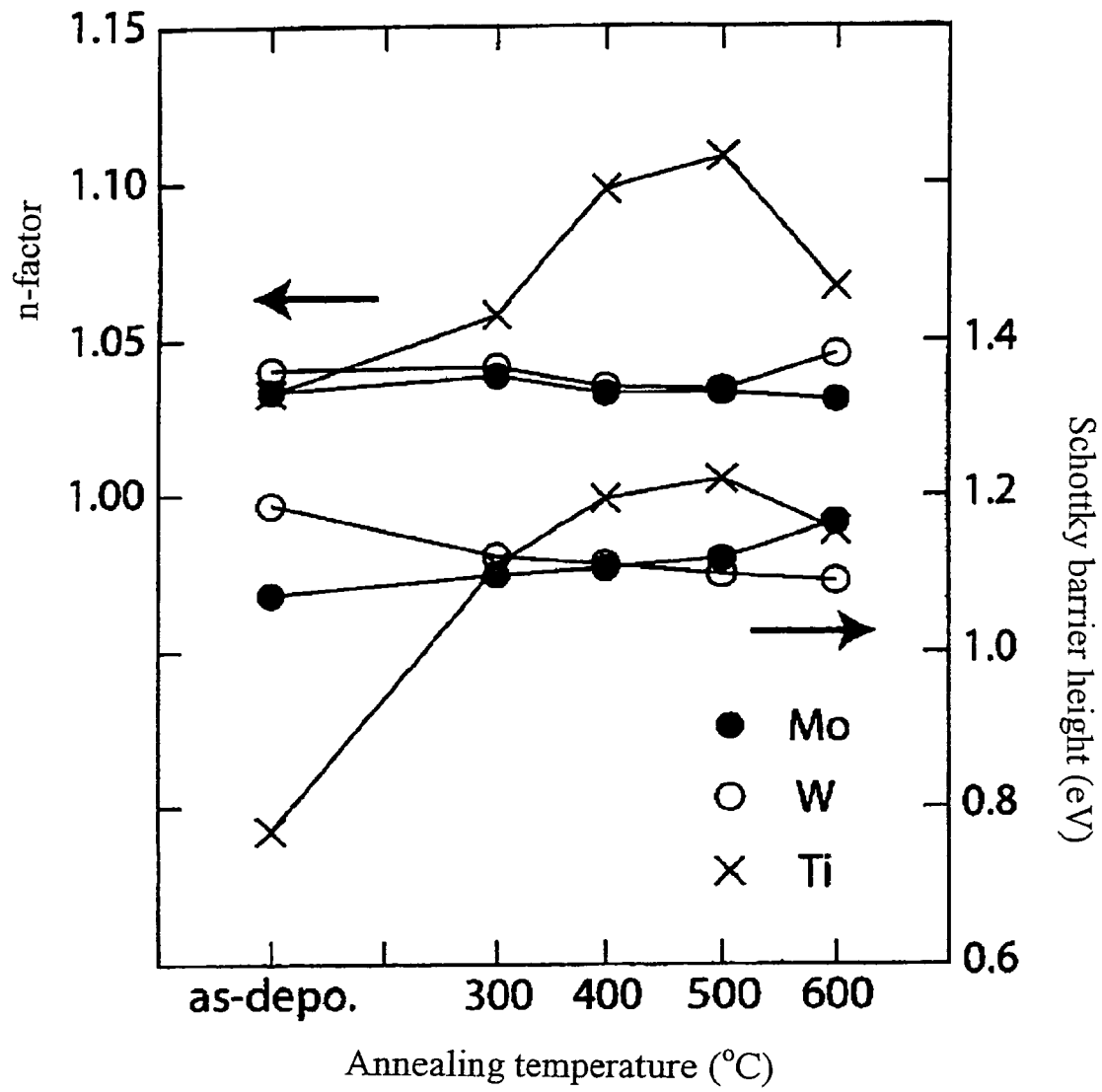
FIG. 2 is a graph showing the relationship among a heat treatment temperature, the Schottky barrier height, and an n-factor.

FIG. 2 shows the relationship between the heat treatment temperature and the Schottky barrier height, and the relationship between the heat treatment temperature and the n-factor. In the case in which molybdenum is used as shown in FIG. 2, the Schottky barrier height is increased from approximately 1.1 eV (before the heat treatment) to approximately 1.2 eV (at 600° C.), however, the n-factor is maintained to 1.05 or a lower value (approximately constant value). In the case in which the heat treatment temperature is 900° C., the Schottky barrier height is 1.27 eV, and the n-factor is 1.05 or a lower value (not shown). In the present embodiment, by the heat treatment at 600° C. for ten minutes, the Schottky barrier height has been controlled to be 1.2 eV which is the optimum value for reducing the power loss in the case of a withstanding voltage of 4 kV.

On the other hand, for titanium that is one of metal that has been used for the Schottky electrode, the Schottky barrier height can be controlled by the heat treatment as shown in FIG. 2. However, since the n-factor is extremely fluctuated and increased at the same time, a leak current is increased in the case in which a reverse voltage is applied, thus affecting the element performance.

Figure 3:
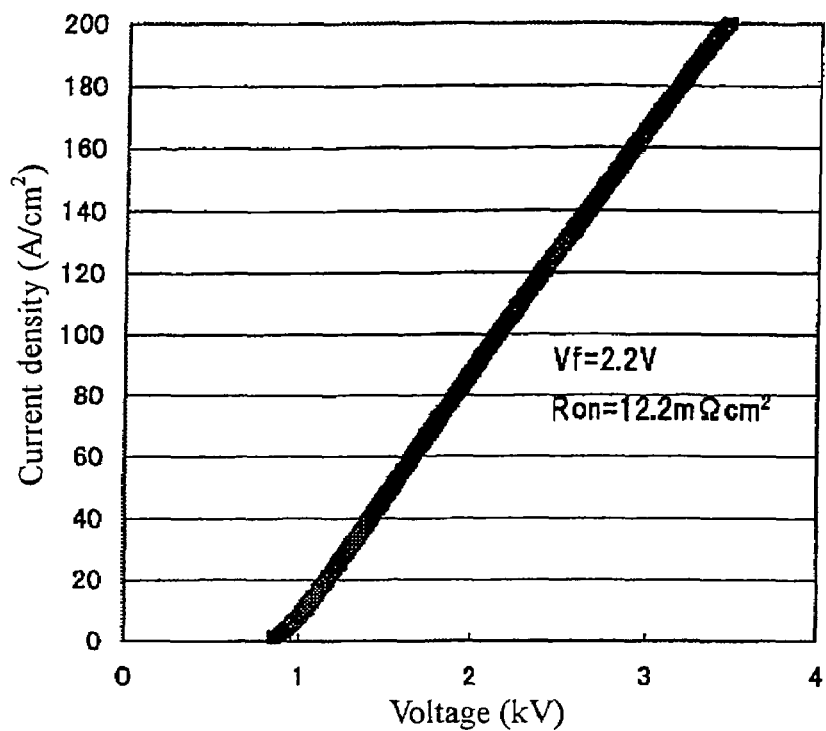
FIGS. 3(a)-(b) are graphs showing the results of the measurement, respectively, of forward and reverse current/voltage for the Schottky diode that has been obtained by the manufacturing process related to the present invention.
Figure 3:
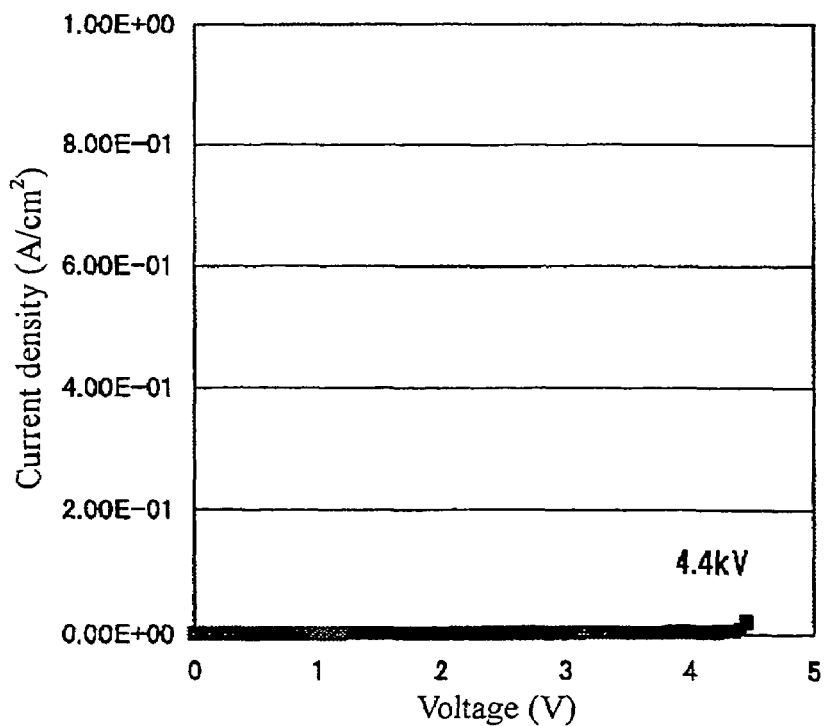

FIG. 3 shows the results of the measurements of the forward and reverse electric current/voltage at a temperature of 20° C. for the Schottky diode that has been obtained by the present embodiment. FIG. 3(a) indicates the forward direction characteristics, and FIG. 3(b) indicates the reverse direction characteristics. The characteristic ON resistance (Ron) is 12.2 mΩcm$^2$, the characteristic ON voltage (Vf: voltage by which a forward current density is 100 Acm$^{-2}$) is 2.2 V, and a withstanding voltage is 4.4 kV. As described above, the Schottky diode with a high withstanding voltage, with extremely low characteristic ON resistance and characteristic ON voltage, and with less power loss, can be obtained.

The following shows the material property values of two Schottky diodes that have been fabricated based on the above described embodiment.

[Schottky diode (1)]
Schottky barrier height (SBH): 1.27 V
n-factor: 1.02
(The following shows values measured at 20° C.)
Characteristic ON resistance: 12.20 mΩcm$^2$
Characteristic ON voltage: 2.16 V
Withstanding voltage: 4.40 V
Leak current density: 0.66 mAcm$^{-2}$ (reverse voltage: 4.0 kV)

[Schottky diode (2)]
Schottky barrier height (SBH): 1.28 V
n-factor: 1.02
(The following shows values measured at 20° C.)
Characteristic ON resistance: 9.07 mΩcm$^2$
Characteristic ON voltage: 1.89 V
Withstanding voltage: 4.15 V
Leak current density: 0.14 mAcm$^{-2}$ (reverse voltage: 3.5 kV)
0.96 mAcm$^{-2}$ (reverse voltage: 4.0 kV)
(The following shows values measured at 150° C.)
Characteristic ON resistance: 29.46 mΩcm$^2$
Characteristic ON voltage: 3.64 V
Leak current density: 0.30 mAcM$^{-2}$ (reverse voltage: 3.0 kV)

Although the leak current density (0.14 mAcm$^{-2}$) at a reverse voltage of 3.5 kV for the Schottky diode (2) is 1/100 or less of that of the 5-kV Ni-4H—SiC Schottky diode that has been reported in the above described non-patent document 2, the characteristic ON voltage (at 25 Acm$^{-2}$) is approximately half of that of the 5-kV Ni-4H—SiC Schottky diode.

Moreover, in the case in which the Schottky diode (2) is operated at 150° C., a forward electric current of 100 mAcm$^{-2}$, and a reverse voltage of 3 kV, the power loss in the ON and OFF states is 364 Wcm$^{-2}$ and 0.9 Wcm$^{-2}$, respectively. Even in such a high temperature environment, the power loss in the OFF state is extremely small as compared with that in the ON state.

Since the high temperature heat treatment is applied to the Schottky electrode in the manufacturing process in advance, the Schottky diode that is obtained by the present invention can be operated stably even in a high temperature environment, thus implementing excellent characteristics in a high temperature environment. For instance, as described above, a leak current is extremely small even in a high temperature environment, and the Schottky diode can be operated at 250° C. Furthermore, even in the case in which an exothermic reaction occurs by a surge current that unexpectedly flows in an element such as a diode, the element is hardly damaged with a high heat resistance property since the high temperature heat treatment has been applied to the Schottky electrode in advance as described above.

In the present embodiment, molybdenum was used as a material for forming the Schottky electrode. However, as shown in FIG. 2, tungsten can also be used to control the height of a Schottky barrier to be the desired value in the range that enables the power loss to be minimized while maintaining the n-factor at a low value without deteriorating element performance. As shown in FIG. 2, the Schottky barrier height that was approximately 1.2 eV before a heat treatment is decreased to approximately 1.1 eV at 600° C., and the n-factor can be maintained at a nearly constant value that is 1.05 or less. At a heat treatment temperature of 700° C., the Schottky barrier height is 1.06 eV and the n-factor is 1.05 or less (not shown).

In the case in which tungsten is used as a material for forming the electrode, after the Schottky electrode is formed by depositing a tungsten film on an SiC epitaxial layer, a heat treatment is performed at the specified temperature. Preferably, a heat treatment should be performed in the ambient atmosphere of an inert gas such as argon or nitrogen. By the above heat treatment, an alloying reaction is progressed at an interface of the silicon carbide epitaxial layer and the Schottky electrode, thereby forming an alloy layer of several nm at the interface. It is thought that the composition of the alloy layer is an alloy composed of WC and WSi.

The heat treatment is performed at a temperature in the range of 300 to 1200° C., preferably 400 to 700° C., to form an alloy layer by reacting tungsten and SiC at the interface. By the above step, the Schottky barrier height can be controlled to be any value in the range of 1.0 to 1.1 eV (1.05 to 1.1 eV at the range of 400 to 700° C.) in such a manner that power loss becomes the smallest optimum value while maintaining the n-factor to 1.05 or a lower value. Even in the case in which the Schottky electrode is formed by using an alloy of molybdenum and tungsten, similar control is enabled by a heat treatment in the above described range of temperatures.

While the preferred embodiments of the present invention have been described above, the present invention is not restricted to the embodiments, and various changes and modifications can be thus made without departing from the scope of the present invention.

An example is described in the following.

The SiC monocrystal substrate can be formed by the bulk growth with the CVD method in addition to the bulk growth with the modified Lely method.

The monocrystal substrate for growing the epitaxial film can also be silicon. In the case in which the SiC monocrystal substrate is used as a substrate for growing the epitaxial film as described in the above embodiment, a crystal type is not restricted in particular, but many kinds of crystal types of SiC monocrystal substrates can be used. For instance, in addition to 4H—SiC (hexagonal crystal four times periodic type) that was used in the above embodiment, preferable models are 6H—SiC (hexagonal crystal six times periodic type) and 3C (cubic crystal three times periodic type)

In the present invention, the crystal plane and crystal orientation for the epitaxial growth on the SiC monocrystal substrate are also not restricted in particular. For instance, the crystal plane in which the epitaxial growth is performed on the SiC monocrystal substrate is the (0001) Siplane, (000-1) C plane, (11-20) plane, (01-10) plane, or (03-38) plane, etc.

In the case in which the epitaxial growth is performed on the (0001) Si plane or (000-1) C plane, a substrate is cut while being inclined at an off-angle of the range of 1 to 12° to the off-orientation of the [01-10] direction, the [11-20] direction, or a middle direction between the [01-10] direction and [11-20] direction, and the epitaxial growth from the crystal plane of the SiC substrate is performed by the step flow growth technology.

For the lattice orientation and lattice plane in the above description, an individual orientation and an individual plane are indicated with [ ] and ( ), respectively. Although a negative index is subject to attachment of "−" (bar) over a number based on crystallography, a negative sign is instead attached in front of the number in order to prepare the present patent specification.

To relax the electric field concentration at the periphery edge of the Schottky electrode, in the case in which the ion implanted layer is formed as described in the present embodiment, ion implantation of other impurities with a conductive type opposite to that of the SiC epitaxial layer can also be performed.

Other than the sputtering method, a vacuum deposition method and an electron beam method can also be used as a method for depositing molybdenum or tungsten on the SiC epitaxial layer.

In the above embodiment, a heat treatment has been performed to the Schottky electrode made of molybdenum in the Schottky diode. Moreover, the present invention can also be applied to the fabrication of a Schottky junction type semiconductor device such as a MESFET using the Schottky electrode as a gate electrode.

The invention claimed is:

1. A process for producing a Schottky junction type semiconductor device, comprising forming a Schottky electrode on a surface of a silicon carbide epitaxial layer, wherein a Schottky electrode made of molybdenum, tungsten, or an alloy thereof is formed on the surface of the silicon carbide epitaxial layer and is subjected to heat treatment so as to induce an alloying reaction at an interface of the silicon carbide epitaxial layer and the Schottky electrode, thereby forming an alloy layer at the interface, whereby the height of a Schottky barrier is controlled in the range of 1.0 to 1.3 eV while maintaining an n-factor at a value of 1.05 or lower.

2. A process for producing a Schottky junction type semiconductor device as defined in claim 1, wherein a heat treatment temperature is in the range of 300 to 1200° C.

3. The process for producing a Schottky junction type semiconductor device as defined in claim 2, wherein the Schottky electrode is made of molybdenum and the height of a Schottky barrier is increased up to the range of 1.1 to 1.3 eV by the heat treatment.

4. The process for producing a Schottky junction type semiconductor device as defined in claim 3, wherein the heat treatment temperature is in the range of 600 to 1200° C.

5. The process for producing a Schottky junction type semiconductor device as defined in claim 1, wherein the silicon carbide epitaxial layer is formed on a SiC monocrystal substrate and wherein an alloy layer that functions as an ohmic electrode is formed on a rear surface of the SiC monocrystal substrate through a heat treatment before forming the Schottky electrode.

6. The process for producing a Schottky junction type semiconductor device as defined in claim 2, wherein the Schottky electrode is made of tungsten and the height of a Schottky barrier is decreased down to the range of 1.1 to 1.0 eV by the heat treatment.

7. The process for producing a Schottky junction type semiconductor device as defined in claim 6, wherein the heat treatment temperature is in the range of 600 to 1200° C.

* * * * *